United States Patent [19]
Zharov et al.

[11] Patent Number: 5,973,578
[45] Date of Patent: Oct. 26, 1999

[54] PROGRAMMABLE SIGNAL TRANSLATING DEVICES AND METHOD OF PROGRAMMING SUCH DEVICES

[75] Inventors: Alexander Zharov, Tel Aviv; Moshe Lerner, Petah Tikva; Mark Levin, Rehovot, all of Israel

[73] Assignee: Unisor Multisystems Ltd, Petah Tikua, Israel

[21] Appl. No.: 09/050,921

[22] Filed: Mar. 31, 1998

[51] Int. Cl.[6] .............................. H03H 9/64; H03H 15/02
[52] U.S. Cl. ........................... 333/166; 333/150; 333/193
[58] Field of Search .................................. 333/150, 152, 333/166, 193

[56] References Cited

U.S. PATENT DOCUMENTS

| | | | |
|---|---|---|---|
| 4,065,736 | 12/1977 | London | 310/366 X |
| 4,665,374 | 5/1987 | Fathimulla | 333/166 X |
| 4,803,449 | 2/1989 | Hikita et al. | 333/193 |
| 5,107,234 | 4/1992 | Ehrmann-Falkenau et al. | 333/195 |
| 5,111,168 | 5/1992 | Panasik et al. | 333/152 |
| 5,115,160 | 5/1992 | Knoll et al. | 310/313 B |
| 5,194,837 | 3/1993 | Smythe, Jr. et al. | 333/166 |
| 5,225,798 | 7/1993 | Hunsinger et al. | 333/165 |
| 5,666,092 | 9/1997 | Yamamoto et al. | 333/194 |
| 5,670,920 | 9/1997 | Morgan | 333/195 |
| 5,694,095 | 12/1997 | Mineyoshi | 333/193 |

*Primary Examiner*—Justin P. Bettendorf
*Attorney, Agent, or Firm*—Benjamin J. Barish

[57] ABSTRACT

A programmable signal translating device, praticularly a transversal filter, includes a wave transport body for transporting a wave along its length, a first channel of electrical conductors having a plurality of code sections spaced along its length for generating phase-coded electrical signals from the wave propagated by the transport body, a second channel of electrical conductors connected in parallel to the first channel and of identical code sections as, but of opposite polarity to, the first channel, and programmable electrical connections between the code sections of the first channel and the code sections of the second channel and the output circuit, for connecting selected code sections of the first and second channels to the output circuit.

15 Claims, 4 Drawing Sheets

PROGRAMMABLE SIGNAL TRANSLATING DEVICES AND METHOD OF PROGRAMMING SUCH DEVICES

FIELD AND BACKGROUND OF THE INVENTION

The present invention relates to signal translating devices and to methods of programming such devices to provide a given type of output signal. The invention is particularly useful in transversal filters of the SAW (surface acoustic wave) type which are programmable to provide a given impulse-response function, and is therefore described below with respect to this application.

A transversal filter of the SAW type includes an acoustic charge transport body, e.g., of piezoelectric material, for transporting a surface acoustic wave along the length of the body. A plurality of electrical conductors spaced along the length of the body define a plurality of code sections for generating, from the SAW (surface acoustic wave), phase-coded electrical signals which are outputted via a plurality of taps spaced along the length of the device. Such transversal filters can be designed to provide any desired impulse-response function.

Generally, such transversal filters are designed at the time of production for the specific impulse-response function to be provided by the filter. This increases the costs for manufacturing, marketing, and inventoring such filters. A number of programmable transversal filters have been described in the literature permitting the user to program the filter according to the desired impulse-response function; see for example, in U.S. Pat. Nos. 4,665,374 and 5,225,798. However, insofar as we are aware, the programmable transversal filters heretofore proposed have not found widespread use.

OBJECTS AND BRIEF SUMMARY OF THE INVENTION

An object of the present invention is to provide a novel signal translating device which is programmable by the user to produce a given type of output signal. Another object of the invention is to provide a programmable transversal filter of the SAW (surface acoustic wave) type to provide a given impulse-response function; and a further object of the invention is to provide a method for programming such signal translating devices and transversal filters.

According to one broad aspect of the present invention, there is provided a signal translating device programmable to provide a given output signal in response to a given input signal, comprising: a wave transport body for supporting the propagation of a wave along the length of the body, an input port for inputting a signal generating the wave, and an output port for outputting an output signal; a first channel of electrical conductors carried on the wave transport body and having a plurality of code sections spaced along the length thereof for generating phase-coded electrical signals from the wave propagated by the wave transport body; and a second channel of electrical conductors carried on the wave transport body connected in parallel to the first channel and including identical code sections as, but of opposite polarity to, the first channel. The electrical conductors of each of the channels include: a common first electrical conductor extending the length of the respective channel and connected to one side of all the code sections of the respective channel; a separate second electrical conductor for each code section extending only for the length of the respective code section and connected to the opposite side of the respective code section; a common third electrical conductor connected to one of the ports and extending the length of the respective channel adjacent to the second electrical conductors of all the code sections of the respective channel; and a bridge from each of the second electrical conductors of each code section of the respective channel to the common third electrical conductor of the respective channel. Each of the code sections in each channel includes a code-section selector circuit enabling the code section to be individually selected by a programming signal. Each of the bridges is normally conductive to connect the second electrical conductor of the respective code section to the one port via the third electrical conductor, but is rendered non-conductive by a code-section selector programming signal applied between the common first and third electrical conductors in each channel to disconnect the code section of the respective channel from the one port.

According to further features in the described preferred embodiment, each bridge is in contact with a material which, when heated, converts the respective bridge from electrically-conducting to electrically-insulating, to thereby open the bridge. The programming circuitry is effective to selectively heat the bridges to be opened according to the desired composition of the output signal.

According to further features in the described preferred embodiment, the code-section selector circuitry includes a resonant circuit for each code section and having a resonant frequency individual to its respective code section; and electrical terminals enabling programming signals to be applied to the code sections of both channels and to be effective to heat only the bridges to be opened according to the desired composition of the output signal.

According to another aspect of the present invention, there is provided a method of programming a signal translating device to produce a given type of output signal.

Although the invention is broadly applicable to signal translating devices in general, where it is desired to provide an output signal of a given composition, the invention is particularly applicable to transversal filters, and especially of the SAW (surface acoustic wave) type, programmable to provide a given impulse-response function; and the invention is therefore described below with respect to this application as being the preferred embodiment of the invention.

Since such a transversal filter is programmable by the user for any desired impulse-responsive function, the filter may be manufactured, marketed and inventoried as a basic unit for universal application, and then programmed for the particular application by the user at the time of use.

Further features and advantages of the invention will be apparent from the description below.

BRIEF DESCRIPTION OF THE DRAWINGS

The invention is herein described, by way of example only, with reference to the accompanying drawings, wherein.

DESCRIPTION OF THE PREFERRED EMBODIMENT

Overall Construction

Figure 1:
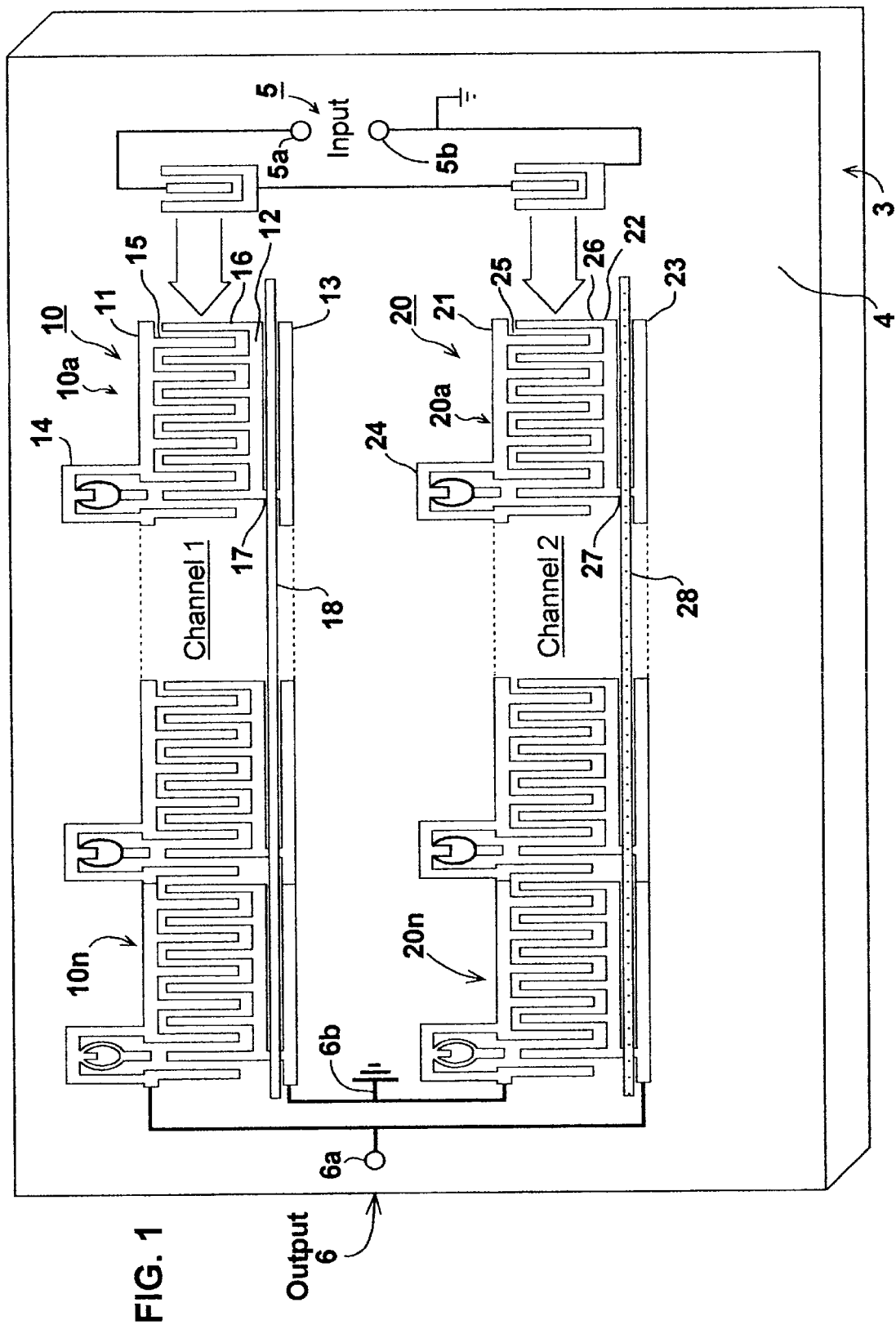
FIG. 1 diagramatically illustrates one form of programmable signal translating device in the form of a transversal filter constructed in accordance with the present invention.

The transversal filter illustrated in the drawings is of the piezoelectric SAW (surface acoustic wave) type, in which a surface acoustic wave propagates along the length of the piezoelectric body, and electrical conductors or electrodes carried on the piezoelectric body define a plurality of code sections along the length of the body for generating and for outputting to an output circuit phase-coded electrical signals according to a given impulse-response function.

Thus, as shown in FIG. 1, the transversal filter includes a piezoelectric body 3 having at least one polished plane surface 4 carrying two electrically-conductive patterns, namely pattern 10 included in a first channel (channel 1), and pattern 20 included in a second channel (channel 2). Both channels are connected in parallel to each other between the input port 5 and the output port 6. The input port 5 includes input terminals 5a, 5b for inputting electrical signals generating the same SAW in both channels, and the output port 6 includes output busses 6a, 6b for outputting electrical signals from the channels. Both channels are of identical construction, including the identical code sections, except that the code sections of channel 2 are of opposite polarity to the code sections of channel 1. Thus, one side of conductive pattern 10 of channel 1 is connected to the opposite side of conductive pattern 20 of channel 2 and to one side of the output circuit 6, namely to bus 6a thereof; whereas the opposite side of conductive pattern 10 of channel 1 is connected to one side of conductive pattern 20 of channel 2 and to the opposite side of the output circuit 6, namely to ground 6b.

As shown in FIG. 1, conductive pattern 10 of channel 1 is divided into a plurality of code sections 10a–10n. Each code section includes a common first electrical conductor or electrode 11 extending the length of the channel and connected to one side of all the code sections of the channel; a separate second electrical conductor or electrode 12 for each code section extending only for the length of the respective code section and connected to the opposite side of the respective code section; and a common third electrical conductor or electrode 13 extending the length of the channel adjacent and parallel to all the separate electrodes 12 of all the code sections of the channel. The longitudinally-extending conductor 11 is connected to the output bus 6a, and the longitudinally-extending conductors 12 are connected (via the common conductor 13, as described below) to the ground 6b.

The sensing electrodes in each code section 10a–10n are of the interdigital type. They include a plurality of transversely-extending fingers 15 connected to conductor 11, and a plurality of transversely-extending fingers 16 interleaved with fingers 15 and connected to conductors 12.

Each code section 10a–10n includes an electrically-conductive bridge 17 (best seen in FIG. 2) connecting ground electrode 12 of the respective code section to the common output conductor 13. All the bridges 17 are covered by a strip of polymeric material 18 which is used, as will be described more particularly below, to convert selected electrically-conductive bridges to electrically-insulating material, and thereby to disconnect the respective code section of channel 1 from the output port 6.

Channel 2 is of an identical construction as channel 1, except that the connections to the output port 6 are reversed so that the polarities of the respective code section outputs are reversed as compared to channel 1.

Figure 3:
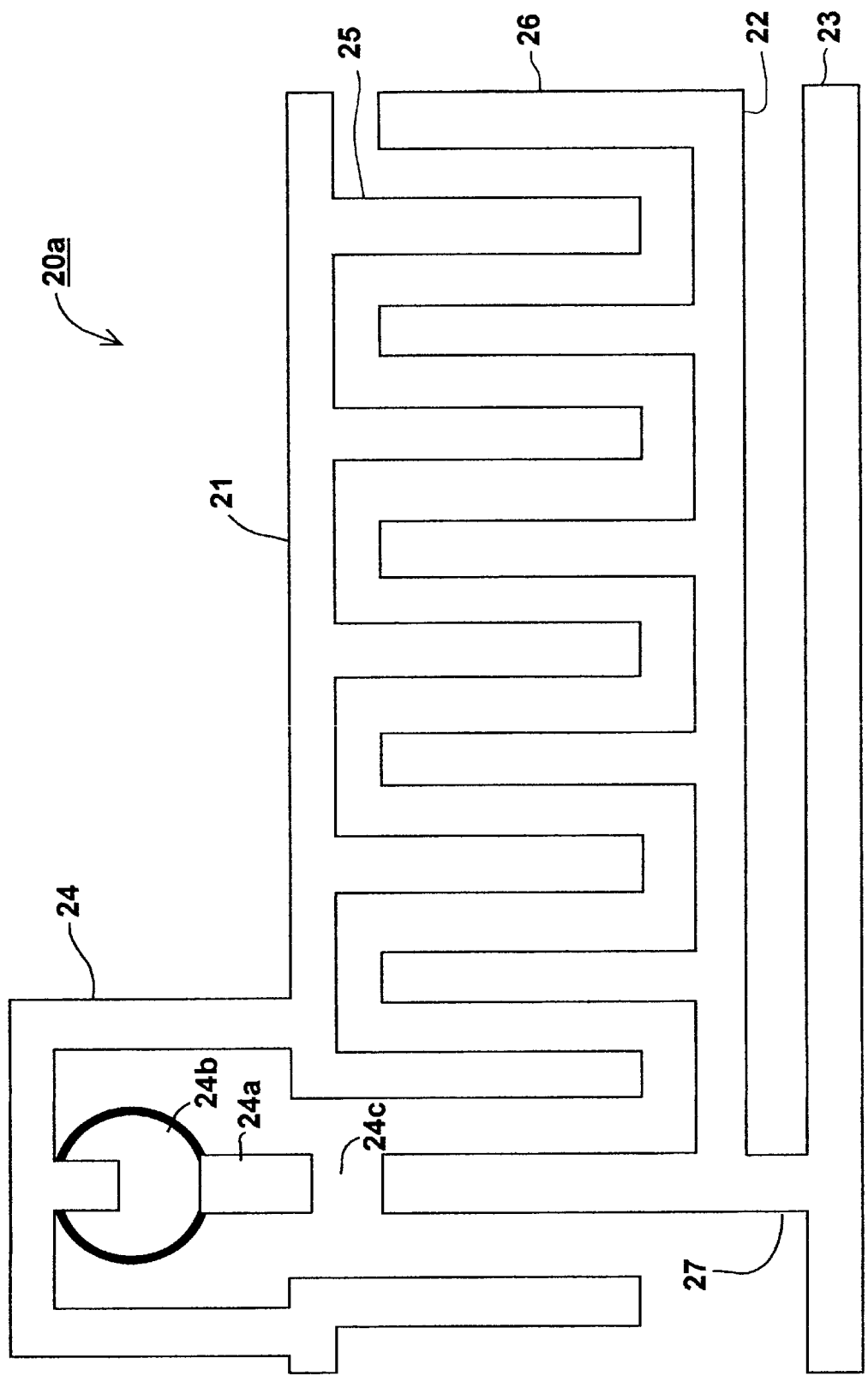
FIG. 3 illustrates the corresponding code section in the second channel in the device of FIG. 1.

Thus, as shown in FIGS. 1 and 3, conductive pattern 20 included in channel 2 is also divided into a plurality of code sections 20a–20n, with each code section including longitudinally-extending conductors 21 and 22, corresponding to conductors 11 and 12 of channel 1, for each code section, and a plurality of transversely-extending fingers 25 connected to electrode 21 and interleaved with a plurality of transversely-extending fingers 26 connected to electrode 22. Channel 2 further includes the common output electrode 23 common to all the code sections, an electrically-conductive bridge 27 connecting electrode 22 of each code section to the common output electrode 23, and a strip of polymeric material 28 overlying the bridges 27.

However as shown in FIG. 1, the output connections of the code sections 20a–20n in channel 2 are opposite to those in channel 1. Thus electrodes 21 of all the code sections 20a–20n in channel 2 are connected, with the common electrode 13 in channel 1, to the ground 6b; whereas the common electrode 23 in all the code sections of channel 2 is connected, with common electrode 11 of channel 1, to the output bus 6a of the output port. Thus, the output voltages generated by each code section 20a–20n in channel 2 and appearing at the output port 6 will be opposite in polarity to the voltages generated by the respective code sections 10a–10n generated in channel 1.

Figure 2:
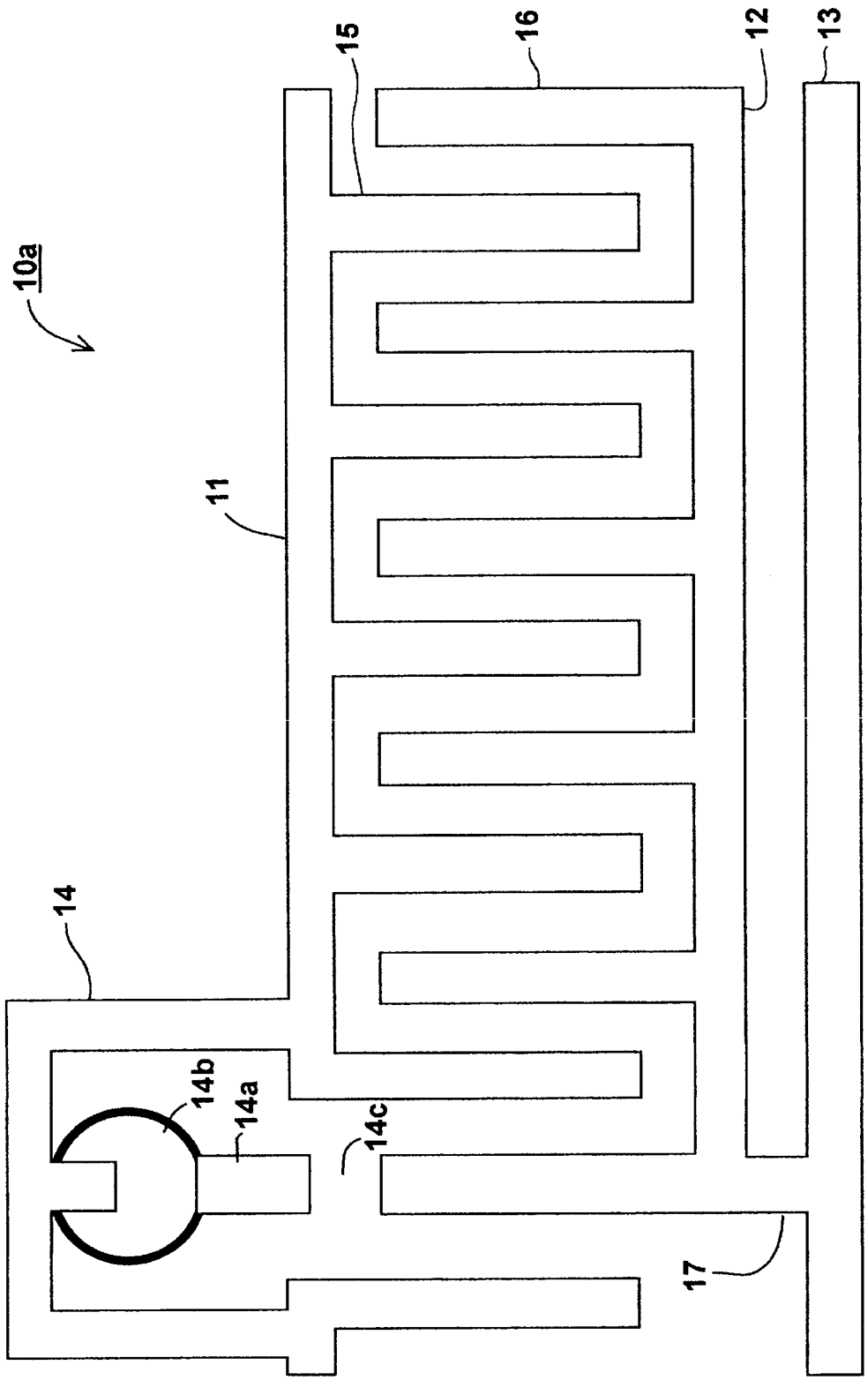
FIG. 2 illustrates one of the code sections in the first channel in the device of FIG. 1.

FIG. 2 more particularly illustrates the electrode array in one of the code sections 10a in channel 1; whereas FIG. 3 illustrates the electrode array in the corresponding code section 20a in channel 2. Since only the electrode arrays are shown in FIGS. 2 and 3, the polymeric strips 18, 28, covering the bridges 17, 27 in the two channels are not shown in these figures.

Figure 4:
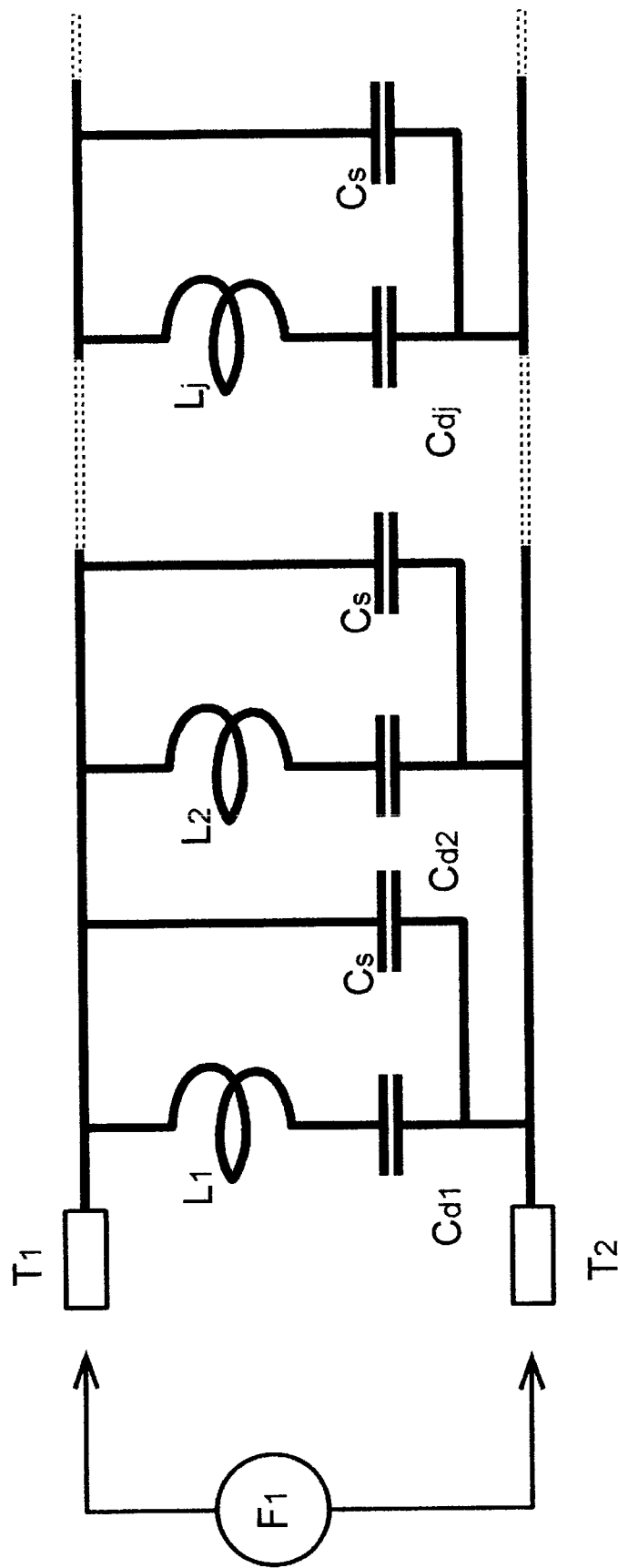
FIG. 4 diagramatically illustrates the programming circuitry of one code section for selectively enabling or disabling that code section in the transversal filter.

As seen in FIG. 2, each of the code sections in channel 10a is provided with a code-section selector circuit, defined by a projection 14 in the common electrode 11 connected to the opposite electrode 12 by an inductance $L_1$ and capacitance $C_{d1}$ (FIG. 4). Inductance $L_1$ and capacitance $C_{d1}$ are schematically indicated in FIG. 2 by inductance 14b connected by lead 14a to gap 14c having a height "h". They together define a resonant circuit which resonates at a predetermined frequency. This resonance frequency is individual for each of the code sections 10a–10n.

A similar construction is provided with respect to each code section in channel 2 as illustrated in FIG. 3, wherein projection 24 in electrode 21, defining the code-section selector circuit of the respective code section, is connected to the opposite electrode 22 via inductance $L_1$ and capacitance $C_{d1}$, schematically indicated by inductance 24b connected by lead 24a to gap 24c having a height "h". As in channel 1, the resonance frequency in channel 2 is also individual for each of the code sections 20a–20n and 10a–10n.

Capacitance $C_S$ in FIG. 4 indicates the inter-electrode capacitance between electrodes 11, 12 in each code section of channel 1, and between the corresponding electrodes 21, 22 in each code section of channel 2.

These resonant circuits are used to enable the removal of bridges 17 in channel 1 and bridges 27 in channel 2 of selected code sections in the two channels. Thus, the circuit for a signal of the frequency of the resonant circuit for the respective code section will have a low resistance, and therefore will produce high current in the bridge 17, 27, of the respective code section. This high current is effective to heat the polymeric material 18, 28 in overlying contact with the respective bridge 17, 27, and to convert the electrically-conductive material of the bridge to electrically-insulating material, thereby disconnecting the respective code section in the respective channel from the output circuit 6.

It will also be seen that the inductances $L_1$ and capacitances $Cd_1$ (FIG. 4) and polymeric strips 18, 28 are located outwardly of the path of the surface acoustic wave being sampled by the electrodes so as not to affect the propagation of that wave.

Operation

The illustrated filter may be programmed as follows to provide a given impulse-response function. Say, for example, the desired impulse-response function includes a plus polarity in the first and fourth code bits, and a minus polarity in the second and third code bits.

For this purpose, a programming signal (Fi, FIG. 4), having components of frequencies equal to the resonant frequencies of the second and third code sections in channel 1, is applied between electrodes 11 and 13 (terminals $T_1$, $T_2$, FIG. 4) of channel 1. Accordingly, bridges 17 in the second and third code sections of channel 1 will be heated by the high current produced by the respective resonant circuit, to cause the overlying polymer layer 18 to convert the electrically-conductive bridges 17 in these code sections to insulating material. This results in the interruption of the bridges 17 in the second and third code sections in channel 1 to the common output conductor 13, but not the bridges in the first and fourth code sections. Accordingly, such a programming signal applied to channel 1 will disconnect the second and third code sections of channel 1 from the output circuit 6, but will retain the first and fourth code sections of the channel connected to the output circuit, so that the signals generated by the first and fourth code sections will appear in the output bus 6a.

A programming signal is also applied between electrodes 21 and 23 of channel 2. This signal will include components having frequencies equal to the resonant frequencies of the first and fourth code sections in channel 2. Thus, bridges 27 in the first and fourth code sections will be heated and converted by the overlying polymer layer 28 to electrically-insulating material, thereby disconnecting the first and fourth code sections of channel 2 from the output circuit 6, but retaining the second and third code sections connected to the output circuit.

It will be seen that, after the filter has thus been programmed, the output circuit will receive plus output signals from the portions of the SAW sensed by the first and fourth code sections of channel 1, and negative output signals for the portions of the SAW sensed by the second and third code sections of channel 2.

The foregoing operations are, of course, applied to all the code sections in both channels 1 and 2 according to the impulse-response function to be programmed into the filter.

As one example, the electrodes of both channels may be thin metal films, such as of aluminum, having a thickness of the order of 2000 angstroms; and the polymer strip 18, 28 may be any of the known materials which, when heated, converts the aluminum (or other conductor material) to aluminum oxide (or to another non-conductive material).

The spacing between the transversly-extending electrodes 15, 16 and 25, 26 in the two channels is preferably equal to one-half the wave length of the surface acoustic wave (SAW) propagated by the piezoelectric body 3. The code sections 10a–10n and 20a–20n are of equal length, each being equal to 5–8 SAW lengths. For example, at a frequency of 30 MHz, the length of each code section would be about 200 microns, and would decrease as the SAW frequency increases. The number of code sections in each channel would be about 100.

While the invention has been described with respect to one preferred embodiment, it will be appreciated that this is set forth merely for purposes of example, and that many variations may be made. For example, the interleaved electrodes 15, 16 and 25, 26 may be of different lengths. In addition, each channel could include other types of electrode arrays. Further, other wave transport devices could be used and divided into a plurality of code sections along its length for generating and outputting phase-coded electrical signals from the transported wave.

Further, the invention could be used in other types of programmable signal translating devices to provide an output signal of a given composition, for example, code conversion systems, image recognition systems, communication systems, ultrasonic systems, tapped delay lines, etc.

Many other variations, modifications and applications of the invention will be apparent.

What is claimed is:

1. A signal translating device programmable to produce a given output signal in response to a given input signal, comprising:

a wave transport body for supporting the propagation of a wave along the length of said body, an input port for inputting said given input signal generating said wave, and an output port for outputting said given output signal;

a first channel of electrical conductors carried on said wave transport body and having a plurality of code sections spaced along the length thereof for generating phase-coded electrical signals from said wave propagated by the wave transport body;

a second channel of electrical conductors carried on said wave transport body connected in parallel to said first channel and including identical code sections as, but of opposite polarity to, said first channel;

said electrical conductors of each of said channels including:

a common first electrical conductor extending the length of the respective channel and connected to one side of all the code sections of the respective channel;

a separate second electrical conductor for each code section extending only for the length of the respective code section and connected to the opposite side of the respective code section;

a common third electrical conductor connected to one of said ports and extending the length of the respective channel adjacent to said second electrical conductors of all the code sections of the respective channel;

and a bridge from each of said second electrical conductors of each code section of the respective channel to said common third electrical conductor of the respective channel;

each of said code sections in each channel including a code-section selector circuit enabling the code section to be individually selected by a programming signal;

each of said bridges being normally conductive to connect said second electrical conductor of the respective code section to said one port via said third electrical conductor, but being rendered non-conductive by a code-section selector programming signal applied between said common first and third electrical conductors in each channel to disconnect the code section of the respective channel from said one port.

2. The device according to claim 1, wherein said electrical conductors in each of said first and second channels include an interdigital array of electrode fingers extending along the length of the channel.

3. The device according to claim 1, wherein each of said bridges is in contact with a material which, when heated, converts the respective bridge from electrically-conducting to electrically-insulating, to thereby open the bridge;

said programming signal being effective to selectively heat the bridges to be opened according to the type of output signal to be produced.

4. The device according to claim 3, wherein said code-section selector circuit includes;

a resonant circuit for each code section and having a resonant frequency individual to its respective code section;

said programming signal being effective to heat only the bridges to be opened according to the output signal to be produced.

5. The device according to claim 1, wherein said wave transport body is a piezoelectrical body for supporting the propagation a surface acoustic wave.

6. The device according to claim 1, wherein said one port is the output port.

7. A method of programming a signal translating device to produce a given output signal in response to a given input signal, comprising:

providing a wave transport body for supporting the propagation of a wave along the length of the body, and having an input port for inputting a signal generating said wave, and an output port for outputting an output signal;

said wave transport body includes at least one channel of electrical conductors having a plurality of code sections spaced along the length thereof for generating phase-coded electrical signals from the transported wave;

said electrical conductors including:

a common first electrical conductor extending the length of the channel and connected to one side of all the code sections of the channel;

a separate second electrical conductor for each code section extending only for the length of the code section and connected to the opposite side of the code section;

a common third electrical conductor connected to one of said ports and extending the length of the channel adjacent to said second electrical conductors of all the code sections of the channel;

and a bridge from each of said second electrical conductors of each code section of the channel to said common third electrical conductor of the channel;

each of said code sections including a code-section selector circuit enabling the code section to be individually selected by a programming signal;

each of said bridges being normally conductive to connect said second electrical conductor of the code section to said one port via said third electrical conductor, but being rendered non-conductive by a code-section selector programming signal applied between said common first and third electrical conductors to disconnect the code section of the channel from said one port;

and disconnecting selected code sections of said channel from the output circuit by applying a code-section selector programming signal between said first and third electrical conductors to render selected ones of said bridges non-conductive.

8. The method according to claim 7, wherein said wave transport body is a piezoelectrical body for supporting the propagation of a surface acoustic wave.

9. The method according to claim 8, wherein said piezoelectric body includes a second channel of electrical conductors connected in parallel to the first-mentioned channel and having identical code sections as said first-mentioned channel but of opposite polarity;

selected code sections of said second channel also being selectively disconnected by a code-section programming selector signal applied to the first and third electrical conductors of said second channel.

10. The method according to claim 9, wherein said selected bridges of the channels are thermally-converted from electrically-conducting material to electrically-insulating material by providing, for each code section, a resonant circuit having a resonant frequency individual to its respective code section;

and applying to all said code sections programming signals having a frequency corresponding to the frequency of the resonant circuit for each code section to be disconnected.

11. A transversal filter programmable to provide a given impulse-response function producing a given output signal in response to a given input signal, comprising:

a piezoelectric body for supporting the propagation of a surface acoustic wave along the length of said body, an input port for inputting a signal generating said wave, and an output port for outputting said given output signal;

a first channel of electrical conductors carried on said piezoelectric body and having a plurality of code sections spaced along the length thereof for generating phase-coded electrical signals from said wave propagated by the piezoelectric body;

a second channel of electrical conductors carried on said piezoelectric body connected in parallel to said first channel and including identical code sections as, but of opposite polarity to, said first channel;

said electrical conductors of each of said channels including:

a common first electrical conductor extending the length of the respective channel and connected to one side of all the code sections of the respective channel;

a separate second electrical conductor for each code section extending only for the length of the respective code section and connected to the opposite side of the respective code section;

a common third electrical conductor connected to one of said ports and extending the length of the respective channel adjacent to said second electrical conductors of all the code sections of the respective channel;

and a bridge from each of said second electrical conductors of each code section of the respective channel to said common third electrical conductor of the respective channel;

each of said code sections in each channel including a code-section selector circuit enabling the code section to be individually selected by a programming signal;

each of said bridges being normally conductive to connect said second electrical conductor of the respective code section to said one port via said third electrical conductor, but being rendered non-conductive by a code-section selector programming signal applied between said common first and third electrical conductors in each channel to disconnect the code section of the respective channel from said one port.

12. The transversal filter according to claim 11, wherein said one port is the output port.

13. The transversal filter according to claim 11, wherein said electrical conductors in each of said first and second channels include an interdigital array of electrode fingers extending along the length of the channel.

14. The transversal filter according to claim 11, wherein each of said bridges is in contact with a material which, when heated, converts the respective bridge from electrically-conducting to electrically-insulating, to thereby open the bridge;

said programming signal being effective to selectively heat the bridges to be opened according to the impulse-response function to be produced in the output circuit.

15. The transversal filter according to claim 14, wherein said code-section selecting circuit includes;

a resonant circuit for each code section and having a resonant frequency individual to its respective code section;

said programming signal being effective to heat only the bridges to be opened according to the given impulse-response function to be produced.

* * * * *